United States Patent
Avraham et al.

(10) Patent No.: US 7,752,380 B2
(45) Date of Patent: Jul. 6, 2010

(54) SDRAM MEMORY DEVICE WITH AN EMBEDDED NAND FLASH CONTROLLER

(75) Inventors: Meir Avraham, Rishon Lezion (IL); Dan Inbar, Yehud (IL); Ziv Paz, Shoham (IL)

(73) Assignee: SanDisk IL Ltd, Kfar Saba (IL)

( * ) Notice: Subject to any disclaimer, the term of this patent is extended or adjusted under 35 U.S.C. 154(b) by 0 days.

(21) Appl. No.: 10/704,613

(22) Filed: Nov. 12, 2003

(65) Prior Publication Data

US 2005/0027928 A1 Feb. 3, 2005

Related U.S. Application Data

(60) Provisional application No. 60/492,217, filed on Jul. 31, 2003.

(51) Int. Cl.
*G06F 13/00* (2006.01)
(52) U.S. Cl. .................. 711/103; 711/E12.001
(58) Field of Classification Search ............. 711/101, 711/103, 104, 105; 365/185
See application file for complete search history.

(56) References Cited

U.S. PATENT DOCUMENTS

| | | | | |
|---|---|---|---|---|
| 6,145,069 A * | 11/2000 | Dye | ............... | 711/170 |
| 6,526,462 B1 * | 2/2003 | Elabd | ............... | 710/242 |
| 6,725,321 B1 * | 4/2004 | Sinclair et al. | ............... | 711/103 |
| 6,772,955 B2 * | 8/2004 | Yoshimoto et al. | ............... | 235/492 |
| 6,791,877 B2 * | 9/2004 | Miura et al. | ............... | 365/185.11 |
| 7,136,978 B2 * | 11/2006 | Miura et al. | ............... | 711/165 |
| 2001/0040750 A1 * | 11/2001 | Murakami et al. | ............... | 360/69 |
| 2002/0114178 A1 | 8/2002 | Sakui | | |
| 2002/0145920 A1 | 10/2002 | Shinohara | | |
| 2002/0185337 A1 | 12/2002 | Miura et al. | | |
| 2003/0028733 A1 * | 2/2003 | Tsunoda et al. | ............... | 711/154 |
| 2003/0160102 A1 | 8/2003 | Yoshimoto | | |
| 2003/0172261 A1 * | 9/2003 | Lee et al. | ............... | 713/1 |
| 2003/0206442 A1 * | 11/2003 | Tang et al. | ............... | 365/185.17 |
| 2004/0083088 A1 * | 4/2004 | Berent et al. | ............... | 703/19 |
| 2004/0179016 A1 * | 9/2004 | Kiser | ............... | 345/531 |
| 2004/0186949 A1 * | 9/2004 | Liu et al. | ............... | 711/104 |

FOREIGN PATENT DOCUMENTS

EP 0566306 10/1993

* cited by examiner

*Primary Examiner*—Reginald G Bragdon
*Assistant Examiner*—Eric Loonan
(74) *Attorney, Agent, or Firm*—Martine Penilla & Gencarella, LLP

(57) ABSTRACT

A memory device includes two dies. A first memory is fabricated on one die. A controller of the first memory is fabricated on the other die. Also fabricated on the other die is another component, such as a second memory, that communicates with a host system using a plurality of signals different from the signals used by the first memory. The device includes a single interface for communicating with the host system using only the respective signals of the second component. In a most preferred embodiment, the first memory is a NAND flash memory and the second memory is a SDRAM.

6 Claims, 4 Drawing Sheets

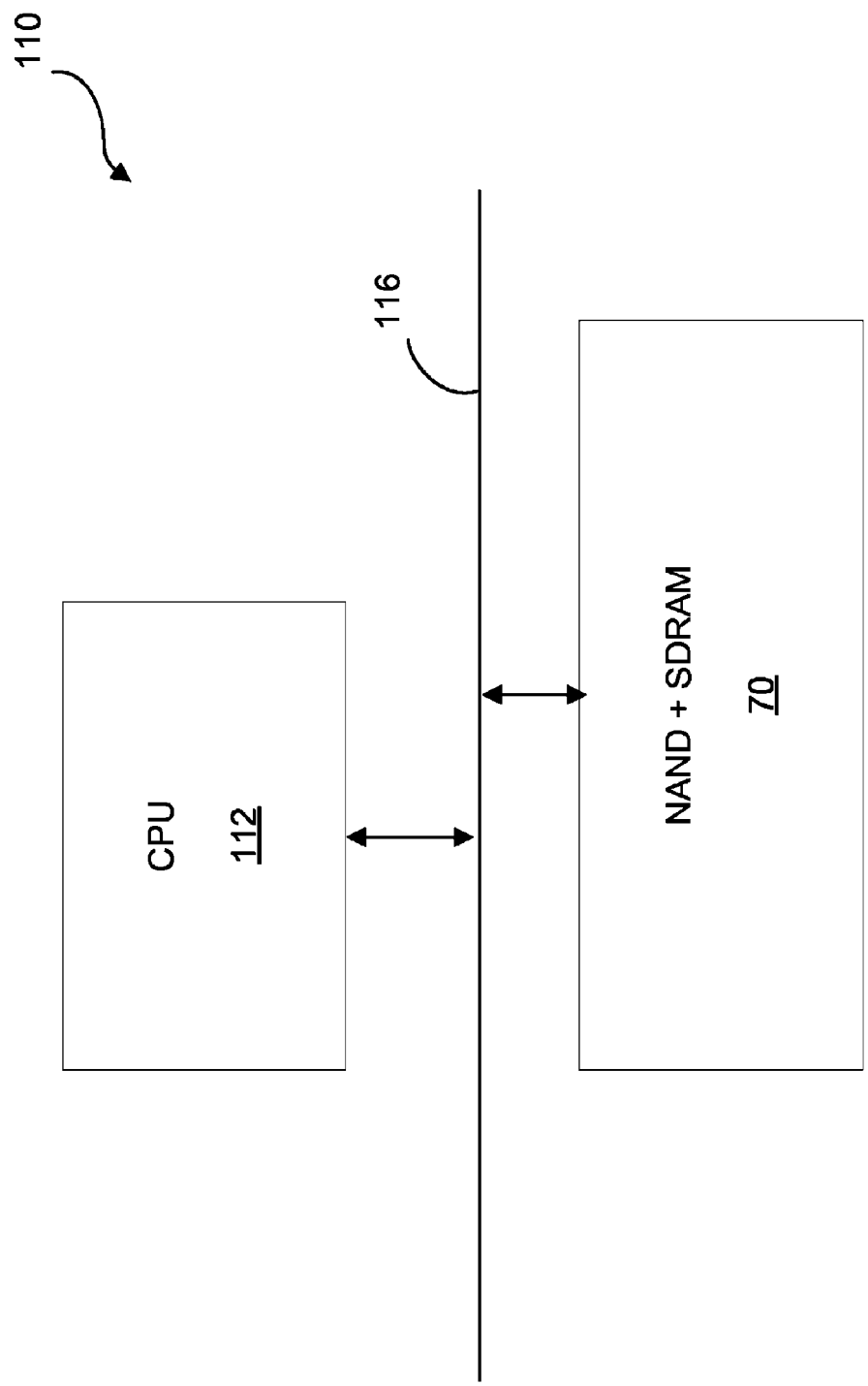

SDRAM MEMORY DEVICE WITH AN EMBEDDED NAND FLASH CONTROLLER

This patent application claims the benefit of U.S. Provisional Patent Application Ser. No. 60/492,217, filed on Jul. 31, 2003.

FIELD AND BACKGROUND OF THE INVENTION

The present invention relates to memory devices and, more particularly, to a MCP (multi-chip package) memory device with a NAND flash memory on one die and a SDRAM (synchronous dynamic random access memory) together with a controller for the NAND flash memory on another die.

FIG. 1 is a partial high level block diagram of a generic prior art embedded device 10. Device 10 includes a central processing unit (CPU) 12 and three memory devices 14, 16 and 18. Memory device 14 includes a nonvolatile memory such as a NOR flash memory for storing the operating system and the pre-stored applications of device 10. Memory device 16 includes a nonvolatile memory such as a NAND flash memory accessed via a NAND controller 17, for storing the user's data and downloaded applications. Memory device 18 is a volatile memory such as a SDRAM for run-time execution. CPU 12 communicates with memory devices 14 and 16 via a bus 20 and with memory device 18 via a bus 22.

The communication protocols of NOR flash memories, NAND flash memories and SDRAM are different. This is why device 10 needs NAND controller 17 and two different buses 20 and 22. If not for prior art technology described below, an implementation of device 10 that used NAND flash memory in memory device 16 would need three buses.

Typical signals for communicating on bus 20 with a synchronous/asynchronous external memory such as a NOR flash memory or a static random access memory (SRAM) include the following:

A[0:x]—Address
D[0:x]—Data
CE#—Chip Select
OE#—Output Enable
WE#—Write Enable
BUSY#—indicates the status of the memory device
Reset#—Reset Signal
CLK—system clock Typical signals for communicating with SDRAM 18 on bus 22 include the following:

CLK—System Clock
CS—Chip Select
CKE—Clock Enable
BA[0:x]—Bank Address
DMQ[0:x]—Data Input/Output
A[0:x]—Row Address, Column Address
DQ[0:x]—Data Input/Output
RAS—Row Address Strobe
CAS—Column Address Strobe
WE—Write Enable A NAND flash memory intrinsically requires a multiplexed interface for Address and Data and control signals which are not included in the signals defined for buses 20 and 22. If a NAND flash memory device were to have its own bus, the associated signals would include:

I/O [0:x]—The I/O pins are used to input command, address and data, and to output data during read operations.
CLE—controls the activating path for commands sent to the command register.
ALE—controls the activating path for address to the internal address registers.
CS—Chip Select (or, equivalently, CE—Chip Enable)
RE—serial data-out control. When active, drives the data onto the I/O bus.
WE—controls writes to the I/O port
R/B—indicates device status In a NOR flash device, reading is random access and fast, similar to RAM (tens of nanoseconds). Writing also is random access but is slow (a few microseconds). Erasing must be done in large chunks called "blocks" and is very slow (a few hundred milliseconds).

In a NAND flash device, reading is serial rather than random access and is somewhat slow (typically 10 to 15 microseconds). Writing must be done in medium-size chunks called "pages" and is slow (a few hundred microseconds). As in the case of a NOR flash device, erasing must be done in blocks, but is much faster (a few milliseconds) than in a NOR flash device.

Recently, NAND flash memory has become an attractive option for data storage in embedded devices such as device 10. This is because of NAND flash's smaller size, lower cost and faster write speed relative to NOR flash. One of the factors that inhibits the migration from NOR flash to NAND flash in embedded devices is the non-standard interface of NAND flash. To overcome this and other limitations of NAND flash, M-Systems Flash Disk Pioneers, Ltd. of Kfar Saba, Israel introduced technology that enables a NAND flash memory device to use the same memory interface as a NOR flash memory device. This technology is implemented in FIG. 1 by NAND flash controller 17. This technology is described in the DiskOnChip® Millennium Plus Data Sheet, which is available on request from M-Systems Flash Disk Pioneers, Ltd., and which is incorporated by reference for all purposes as if fully set forth herein.

FIG. 2 is a simplified block diagram of a prior art NAND flash memory device 30, specifically M-Systems' DiskOnChip® Millennium Plus. Device 30 includes a NAND flash memory 34 and a controller 32 of NAND flash memory 34, both fabricated on a common die 36. The functional blocks of controller 32 include:

A system interface 38 for interfacing with the rest of a host system such as device 10

A configuration interface 58 for configuring device 30 to operate in 8 bit vs. 16 bit mode, cascaded configuration and hardware write protection A protection and security-enabling block 52 including Write/Read protection and One-Time Programming (OTP), for advanced data/code security and protection A programmable boot block 40 with execute-in-place (XIP) capability, enhanced with a download engine 42, for host system initialization capability An error detection and error correction code block 54 for on-the-fly error handling A data pipeline 44 through which data flows from the host system to NAND flash memory 34

A control and status block 50 that contains registers responsible for transferring the address, data and control information between the software driver and the NAND flash memory 34

A flash interface 56

A bus control block 48 for translating the host system bus address, data and control signals into valid NAND flash signals An address decoder 46 to enable the relevant unit inside controller 32, according to the address range received from system interface 38.

More details of these functional blocks are given in the DiskOnChip® Millennium Plus Data Sheet. To the left of device 30 in FIG. 2 are shown some of the signals that device 30 exchanges with the host system.

Unlike NOR flash, in which reading is random access, NAND flash does not support execution-in-place, such as is needed to boot the host system. The inclusion of boot block 40 in controller 32 gives device 30 a boot capability that would otherwise be available only in a device such as a NOR flash memory device. Hence, device 30 or a similar device can provide the functionality of both memory device 14 and memory device 16 in device 10. Such a device 30 could be conveniently packaged inside a common MCP package with SDRAM 18. Because of the need to use two buses 20 and 22, however, such an MCP would have to have a correspondingly large number of pins.

There is thus a widely recognized need for, and it would be highly advantageous to have, a memory device including both a NAND flash memory and a SDRAM that can communicate with a host system via a single external bus.

SUMMARY OF THE INVENTION

According to the present invention there is provided a memory device including: (a) a first die on which is fabricated a first memory; and (b) a second die on which are fabricated: (i) a controller for the first memory, and (ii) at least one additional component.

In its most basic form, a first memory device of the present invention includes two dies. A first memory is fabricated on the first die. A controller for the first memory, and also at least one additional component, are fabricated on the second die.

Preferably, both dies are packaged together in a common package. Most preferably, the first device includes a plurality of pins for operationally connecting the first device to a host system. As understood herein, the term "pin" refers to any kind of lead for establishing an electrical connection between the first device of the present invention and a host system. So, for example the balls of a ball grid array are examples of "pins" as the term "pin" is used herein.

Preferably, the first memory is a nonvolatile memory. More preferably, the first memory is a flash memory. Most preferably, the first memory is a NAND flash memory.

Preferably, one of the additional components is a second memory. Most preferably, the second memory is a volatile memory such as a SDRAM. If the second memory is a SDRAM, then preferably the first device of the present invention includes (for example as part of the controller) a single interface, to a host system, that is appropriate to the SDRAM.

Preferably, the first memory and the additional component(s) communicate with a host system using different respective pluralities of signals. Most preferably, the first device of the present invention includes (for example as part of the controller) a single interface to the host system for communicating with the host system only using the respective signals of the additional component(s), and not the respective signals of the first memory.

Preferably, the controller includes a XIP boot block.

Preferably, the controller also is operative to manage one of the additional component(s). Most preferably, the additional component managed by the controller is a second memory, and the controller provides paging and/or hardware decompression for the second memory.

The scope of the present invention also includes a system that includes the first memory device of the present invention, a CPU and a single bus for communication between the CPU and the first memory device of the present invention. Preferably, the communication via the bus are via signals that are appropriate only to the additional component(s) and not to the first memory.

Also according to the present invention, there is provided a memory device including: (a) a first die on which is fabricated a first memory and a controller for a second memory.

In its most basic form, a second memory device of the present invention includes a first die on which is fabricated a first memory and a controller for a second memory.

Preferably, the second memory is a nonvolatile memory. More preferably, the second memory is a flash memory. Most preferably, the second memory is a NAND flash memory.

Preferably, the first memory is a volatile memory such as a SDRAM. If the first memory is an SDRAM, then preferably the second device of the present invention includes (for example as part of the controller) a single interface, to a host system, that is appropriate to the SDRAM.

Preferably, the second device of the present invention also includes a second die on which is fabricated the second memory. More preferably, both dies are packaged together in a common package. Most preferably, the second device includes a plurality of pins for operationally connecting the second device to a host system.

Preferably, the two memories communicate with a host system using different respective pluralities of signals. Most preferably, the second device of the present invention includes (for example as part of the controller) a single interface to the host system for communicating with the host system only using the respective signals of the first memory, and not the respective signals of the second memory.

Preferably, the controller includes a XIP boot block.

Preferably, the controller also is operative to manage the first memory, for example by providing paging and/or hardware decompression for the first memory.

The scope of the present invention also includes a system that includes the basic second memory device of the present invention, a CPU and a single bus for communicating between the CPU and the second memory device of the present invention. Normally, the system also includes the second memory. Preferably, the communication via the bus are via signals that are appropriate only to the first memory and not to the second memory.

Definitions

The scope of the term "SDRAM" as used herein includes any type of synchronous dynamic RAM, including but not limited to DDR SDRAM, QDR SDRAM and derivatives thereof.

BRIEF DESCRIPTION OF THE DRAWINGS

The invention is herein described, by way of example only, with reference to the accompanying drawings, wherein:

FIG. 4 is a partial high-level block diagram of a generic embedded device of the present invention.

DESCRIPTION OF THE PREFERRED EMBODIMENTS

The present invention is of a memory device that includes two kinds of memories but communicates with a host device or system using the protocol and signals of only one of the memories. The present invention thereby enables the host device or system to include only one bus for communicating with the two memories.

The principles and operation of a memory device according to the present invention may be better understood with reference to the drawings and the accompanying description.

Figure 1:
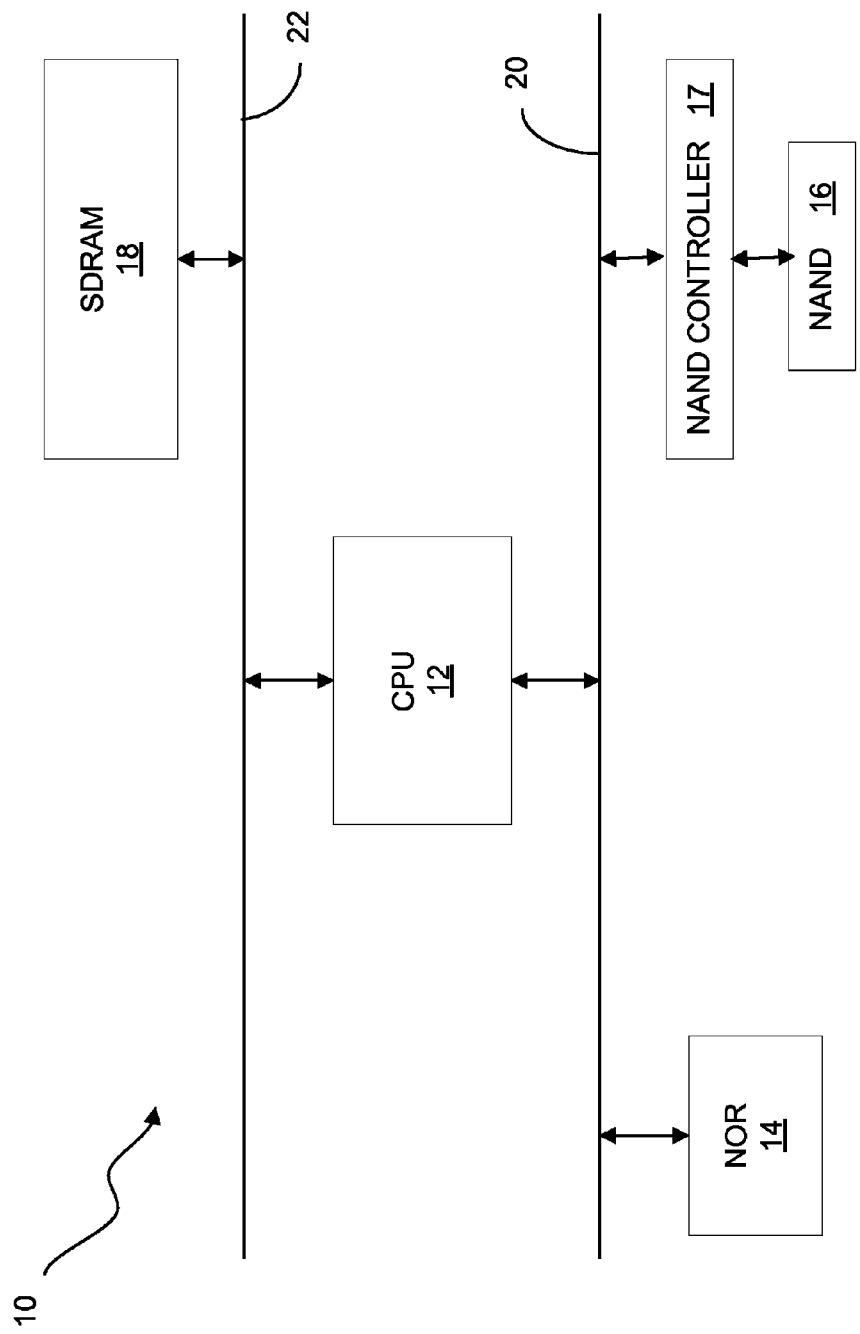
FIG. 1 is a partial high-level block diagram of a generic prior art embedded device.
Figure 2:
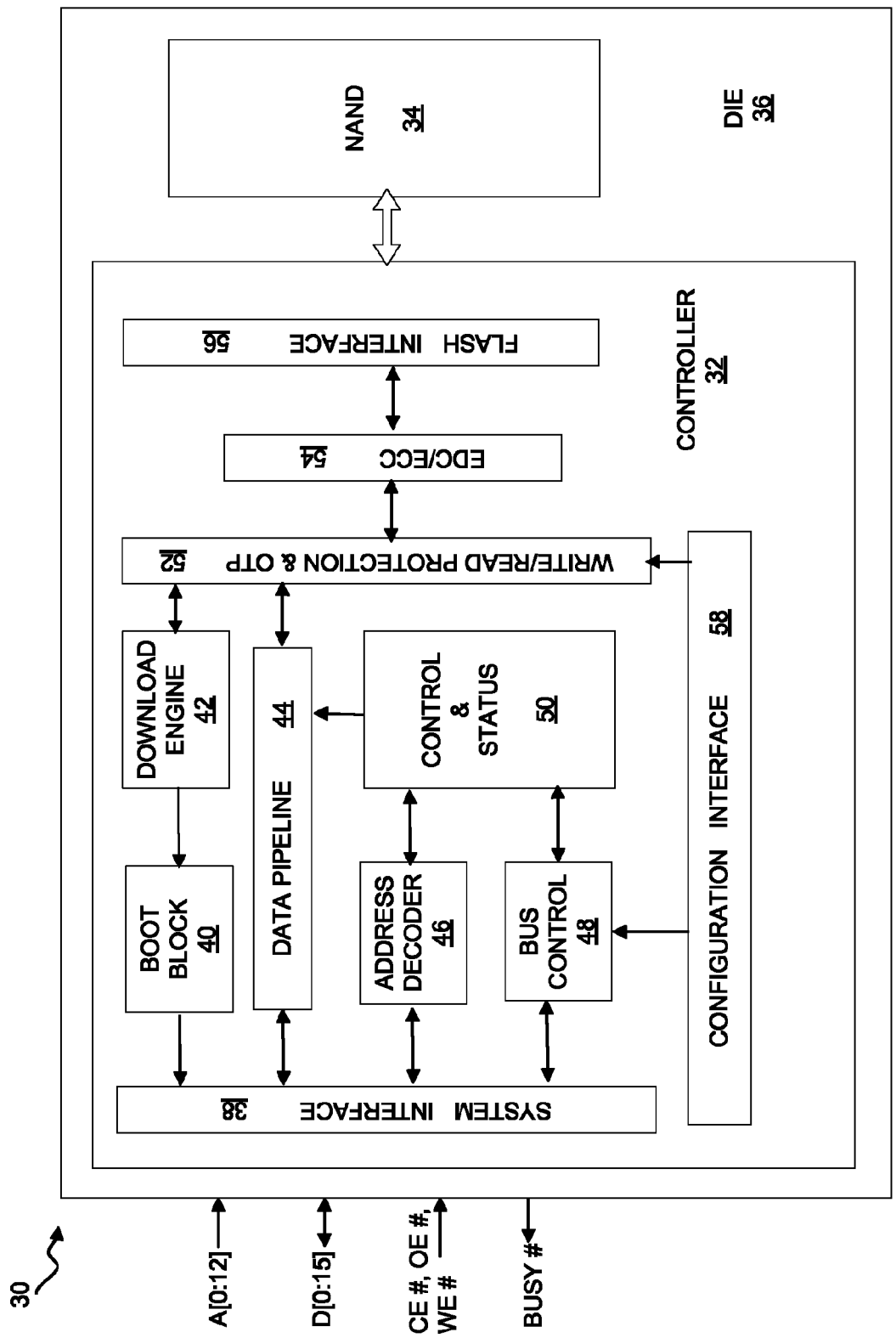
FIG. 2 is a simplified block diagram of a DiskOnChip® Millennium Plus NAND flash memory device.
Figure 3:
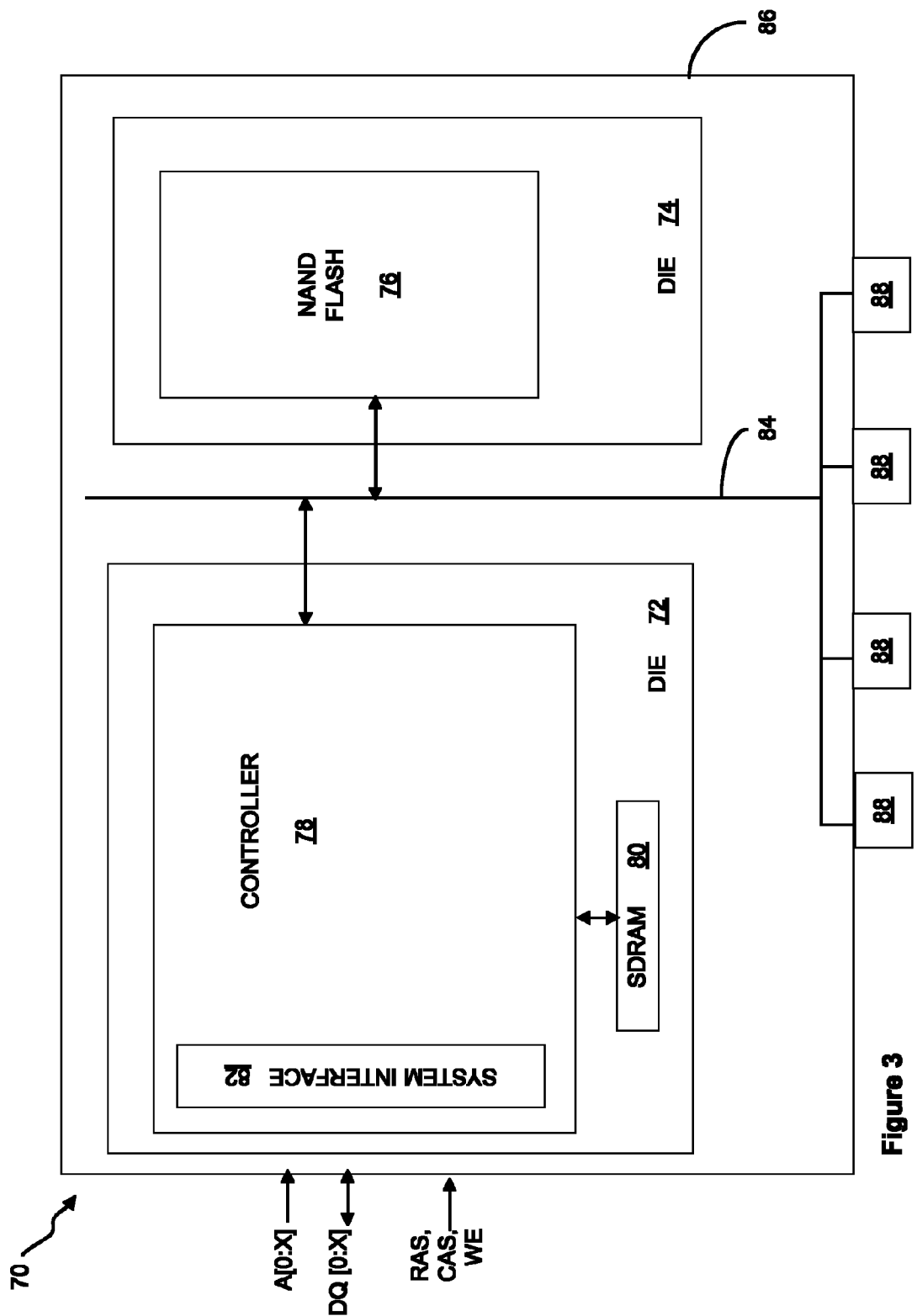
FIG. 3 is a high-level block diagram of a memory device of the present invention.

Returning now to the drawings, FIG. 3 is a high-level block diagram of a memory device 70 of the present invention. Device 70 includes two dies 72 and 74. Fabricated on die 74 is a NAND flash memory 76. Fabricated on die 72 are a controller 78 for NAND flash memory 76 and a SDRAM 80. Controller 78 is similar to prior art controller 32. There are three principal differences between controller 78 and controller 32. The first difference is that in addition to communicating with NAND flash memory 76 (via an internal bus 84), controller 78 also communicates directly with SDRAM 80, for example in a direct memory access (DMA) mode. The second difference is that controller 78 can act as a "short" that passes signals directly between the CPU 112 of a host system 110 that includes memory device 70 (see FIG. 4 as described below) and SDRAM 80, with no change to the signals. The third difference is that the signals that controller 78 uses to communicate with an external host system are the signals appropriate to SDRAM 80. Some of these signals are illustrated to the left of device 70. In terms of the functional blocks of controller 78, the only functional block of controller 78 that differs substantially from the corresponding functional block of controller 32 is the system interface block. Unlike system interface block 38 of controller 32, which supports communication according to a protocol appropriate to a synchronous/asynchronous memory such as a NOR flash memory, system interface block 82 of controller 78 supports communication according to a protocol appropriate to SDRAM 80. Therefore, the only functional block of controller 78 that is illustrated in FIG. 3 is system interface block 82. It will be clear to those skilled in the art what additional functionality is required in controller 78 to support direct access such as DMA to SDRAM 80. Therefore, this direct access support functionality is not detailed herein.

Dies 72 and 74 are packaged together in a common package 86, so that device 70 is a MCP device. Protruding from package 86 is a plurality of pins 88. Device 70 typically includes significantly fewer pins than the number of pins that device 70 would need to support two separate communication protocols for NAND flash memory 76 and SDRAM 80. For illustrational simplicity, only four pins 88 are shown in FIG. 3.

FIG. 3 illustrates a basic memory device 70 of the present invention. A more sophisticated memory device 70 of the present invention includes optional features that take advantage of the presence of NAND flash memory 76 and SDRAM 80 in the same device, for example a decompression engine in controller 78 for compressing data to be stored in NAND flash memory 76 and decompressing that data when that data is loaded from NAND flash memory 76 to SDRAM 80.

FIG. 4 is a partial high level block diagram of a generic embedded device 110 of the present invention. CPU 112 of device 110 is similar to CPU 12 of device 10. The principal difference between device 10 and device 110 is that in device 110 the functionality of memory devices 14, 16 and 18 is combined into memory device 70 of the present invention. Specifically, NAND flash memory 76 is used for storing the operating system and the pre-stored applications of device 110 and also for storing the user's data and downloaded applications; and SDRAM 80 is used for run-time execution. Consequently, device 110 needs only one bus 116 for communicating with its single memory device 70, using only signals appropriate for SDRAM 70.

In addition to the reduced number of buses in device 110 vs. device 10, the present invention offers the following advantages over the prior art:

1. If (as is preferable) SDRAM 80 is large enough both to hold a shadowed image of the operating system of device 110 and also to provide the memory space required for run time execution, then, because controller 78 includes a boot block and a download engine similar to boot block 40 and download engine 42 of controller 32, device 70 is a chipset that can boot directly from SDRAM 80. Because execution from a SDRAM is substantially faster than execution from a NOR flash memory, device 110, if so configured, operates significantly faster than device 10.

2. Because device 110 does not need bus 20 to support communication with a NOR flash memory device. CPU chipset vendors are free to eliminate NOR/SRAM signals and the associated pins from their chips. This results in reduced die size, reduced cost of the chipsets and physically smaller package sizes.

3. The transfer of data from NAND flash memory 76 to SDRAM 80 is a fast, direct transfer at low power and without loading an external bus, unlike the transfer of data from NAND flash memory device 16 to SDRAM memory device 18 via external buses 20 and 22.

4. Optionally, memory management functionality, such as paging and hardware decompression, for managing SDRAM 80 may be included in controller 78. In device 10, bus 22 and CPU 12 would have to participate in such functionality.

While the invention has been described with respect to a limited number of embodiments, it will be appreciated that many variations, modifications and other applications of the invention may be made.

What is claimed is:

1. A memory device comprising:
    (a) a RAM operative to provide run-time execution functionality to a host, the RAM defined on a first die;
    (b) a flash memory operative to store, for said host, code selected from the group consisting of an operating system, a pre-stored application, a downloaded application and user data, the flash memory defined on a second die, the flash memory capable of communicating directly with a host system using different signals that are distinct from signals communicated by the RAM;
    (c) an interface for communicating with said host using only a RAM protocol; and
    (d) a controller, of the flash memory, that is operative to exchange said code residing on the flash memory directly with said host using said RAM protocol independently of said RAM and without using said RAM, in support of said storing of said code, and that also is operative to exchange signals directly between said interface and said RAM in support of said run-time execution functionality, the controller fabricated on the first die alongside the RAM.

2. The memory device of claim 1, wherein said flash memory is a NAND flash memory.

3. The memory device of claim 1, wherein said RAM is an SDRAM.

4. The memory device of claim 1, wherein said interface is a sole interface for communicating with said host.

5. An embedded device, comprising:
    (a) a CPU;
    (b) a memory device that includes:
        (i) a RAM for providing run-time execution functionality to said CPU, said RAM defined on a first die, (ii) a flash memory in which said CPU accesses code selected from the group consisting of an operating system, a pre-stored application, a downloaded application and user data, said flash memory defined on a second die that is distinct from the first die, the flash memory capable of communicating directly with a host system using different signals that are distinct from signals communicated by the RAM; and (c) a communication link, whereby said CPU and said memory device communicate with each other using only signals of a RAM protocol; and wherein said memory device further includes:

(iii) a controller, of the flash memory, that is operative to exchange said code residing on the flash memory directly with said CPU using said RAM protocol independently of said RAM and-without using said RAM, in support of said accessing of said code, and that also is operative to exchange said signals directly between said CPU and said RAM in support of said run-time execution functionality, the controller fabricated on the first die alongside said RAM.

6. A method of operating an embedded device that includes a CPU, a RAM, a flash memory and a controller of the flash memory, the method comprising the following steps performed by the CPU:

(a) using a RAM protocol to communicate with the RAM for run-time execution, wherein the RAM is defined on a first die;

(b) storing, in the flash memory, code selected from the group consisting of an operating system, a pre-stored application, a downloaded application and user data, wherein the flash memory is defined on a second die that is distinct from the first die, the flash memory capable of communicating directly with a host system using different signals that are distinct from signals communicated by the RAM; and (c) using said RAM protocol to communicate with the controller for directly accessing said code in the flash memory, said code being accessed by the controller independently of the RAM and without using the RAM, wherein the controller is defined on the first die alongside the RAM.

* * * * *